United States Patent [19]
Hanrahan et al.

[11] Patent Number: 5,296,844
[45] Date of Patent: Mar. 22, 1994

[54] ELECTRICAL CONTACT AVOIDANCE DEVICE

[75] Inventors: Robert C. Hanrahan, Whitby; James Williamson, Courtice, both of Canada

[73] Assignee: Ontario Hydro, Toronto, Canada

[21] Appl. No.: 826,058

[22] Filed: Jan. 27, 1992

[51] Int. Cl.⁵ ........................................... G08B 21/00
[52] U.S. Cl. ................................. 340/657; 340/661; 340/654; 324/457; 182/230
[58] Field of Search ............... 340/657, 660, 661, 654, 340/650, 662; 324/457, 433, 133, 557; 182/2, 46, 141; 361/91

[56] References Cited

U.S. PATENT DOCUMENTS

| | | |
|---|---|---|
| 2,037,946 | 4/1936 | Stusser . |
| 2,255,897 | 9/1941 | Rebori . |
| 2,535,053 | 12/1950 | Ercolino . |
| 3,309,690 | 3/1967 | Moffitt ................................ 340/657 |
| 3,320,524 | 8/1967 | Miller ............................. 340/657 X |
| 3,329,957 | 7/1967 | Hoynes . |
| 4,714,915 | 12/1987 | Hascal et al. ................... 324/457 X |
| 4,804,922 | 2/1989 | Sometari et al. .................... 324/457 |
| 4,983,954 | 1/1991 | Huston ............................... 340/657 |

FOREIGN PATENT DOCUMENTS 1265581 2/1990 Canada .

Primary Examiner—Jeffrey Hofsass
Attorney, Agent, or Firm—Ridout & Maybee

[57] ABSTRACT

An electrical contact avoidance device comprises an inductor plate directly or capacitively coupled to the user and coupled to a detector circuit which derives a DC signal corresponding to a voltage induced in the user's body by a radiated high voltage electrostatic field. A comparator compares the DC signal with a reference signal representing the potential difference between the inductor and reference plates, and activates an alarm if the detected signal exceeds a preselected reference level.

12 Claims, 3 Drawing Sheets

ELECTRICAL CONTACT AVOIDANCE DEVICE

FIELD OF THE INVENTION

This invention relates to an electrical contact avoidance device. In particular, this invention relates to a portable monitoring system for use by linemen and others who work in the vicinity of high voltage lines and equipment, which monitors the voltage induced in a worker's body when in the vicinity of an electrostatic field surrounding a high voltage conductor, and emits an audible alarm when the lineman using the device approaches a high voltage conductor too closely.

BACKGROUND OF THE INVENTION

A number of safety devices of this general type are available, such as that described in U.S. Pat. No. 4,714,915 (Hascal et al) issued Dec. 22, 1987. Such a device may be installed on a safety helmet worn by the user. However, such devices pose significant disadvantages in practise.

These devices employ the principle of electrostatic induction on parallel plates, in which one plate is an inductor plate, or antenna, and a floating reference voltage is produced in a parallel plate. The antenna is connected to the input of a detector circuit which derives a DC signal corresponding to the intensity of the electrostatic field at the position of the antenna. A comparator compares the DC signal with a selected reference signal, and produces an output signal when the derived DC signal exceeds the reference signal, sounding an audible alarm.

A main disadvantage to this system is that the antenna, typically comprising a stripline antenna mounted on or around the user's helmet, can be shielded from the electrostatic field by the user. Thus, depending upon the position and orientation of the user relative to the energized conductor, the electrostatic field intensity at the position of the user may exceed the selected limit without sounding the alarm, if any portion of the user's body is interposed between the field source and the antenna. On the other hand, in certain orientations the alarm will sound when the user himself is not within the selected minimum distance of the high voltage conductor, as determined by the selected maximum intensity of the electrostatic field, if any part of the antenna strays within that distance. The latter situation can be an annoyance, while the former situation can be dangerous.

The present invention overcomes this disadvantage by providing an electrical contact avoidance system in which the body of the user forms the antenna. Since it is ultimately the user, and not the device, which must avoid contact with the high voltage conductor, by utilizing the user's body as the antenna the alarm will not sound unless part of the user's body approaches the field source too closely; nor can the user stray within the minimum selected distance from the field source without triggering the alarm. The electrical contact avoidance device of the present invention thus avoids the annoyance of false alarms and at the same time ensures that whenever any part of the user strays within the selected minimum distance from the conductor the alarm will sound, regardless of his or her orientation.

The system of the present invention further provides a support basket for a powered aerial access device which may be coupled to ground or to a high voltage conductor being serviced, or allowed to assume a floating voltage reference, a platform insulated from the basket to which the lineman is directly or capacitively coupled, and a monitoring circuit connected between the platform and the basket. Where the basket is grounded, or electrically isolated from the conductor, the monitoring device will sound an alarm if the lineman approaches a high voltage conductor too closely. Alternatively, the basket and lineman may be coupled or "bonded" to the high voltage conductor, enabling the lineman to work hands-on with the conductor, and the alarm will sound if the lineman approaches a grounded conductor or a different phase or voltage conductor. In either case, the lineman is protected from electrical shock by avoidance of any conductor energized to a voltage or phase different from that of the lineman's body.

The subject invention is based on the premise that an electrostatic field produced by a high voltage conductor induces a detectable voltage in a person's body, as in any other conductor. This induced voltage is directly related to the intensity of the electrostatic field, and thus the proximity of the person to the field source, i.e. the high voltage conductor.

SUMMARY OF THE INVENTION

The present invention thus provides a portable monitoring system for detecting a voltage induced in a user's body by a radiated electrostatic field, and producing a warning when the voltage exceeds a selected value, comprising an inductor plate coupled to the user's body and to a detector circuit for deriving a DC signal corresponding to the voltage induced in the user's body, a reference plate, comparator means for comparing the DC signal with a selected reference signal representing a potential difference between the inductor plate and the reference plate, and alarm means responsive to an output signal produced by the comparator.

The present invention further provides a portable monitoring system for detecting a voltage induced in a user's body by a radiated electrostatic field, and producing a warning when the detected voltage exceeds a selected value, comprising a platform having an inductor plate separated from a reference plate by an electrically insulating frame, a monitoring circuit having detector circuit means for deriving a DC signal corresponding to the detected voltage, comparator means for comparing the DC signal with a selected reference signal representing the potential difference between the inductor plate and the reference plate, and alarm means responsive to an output signal from the comparator.

The present invention further provides a powered aerial access device for elevating a person comprising a vehicle having actuating means for raising and lowering a basket, the basket including a platform having an inductor plate insulated from the basket, monitoring circuitry comprising a detector circuit for deriving a DC signal corresponding to a detected potential on a person's body, comparator means for comparing the DC signal with a selected reference signal for producing an output signal when the DC signal level exceeds the reference signal level, and alarm means responsive to the output signal.

BRIEF DESCRIPTION OF THE DRAWINGS

In drawings which illustrate by way of example only a preferred embodiment of the present invention.

DETAILED DESCRIPTION OF THE INVENTION

Figure 1:
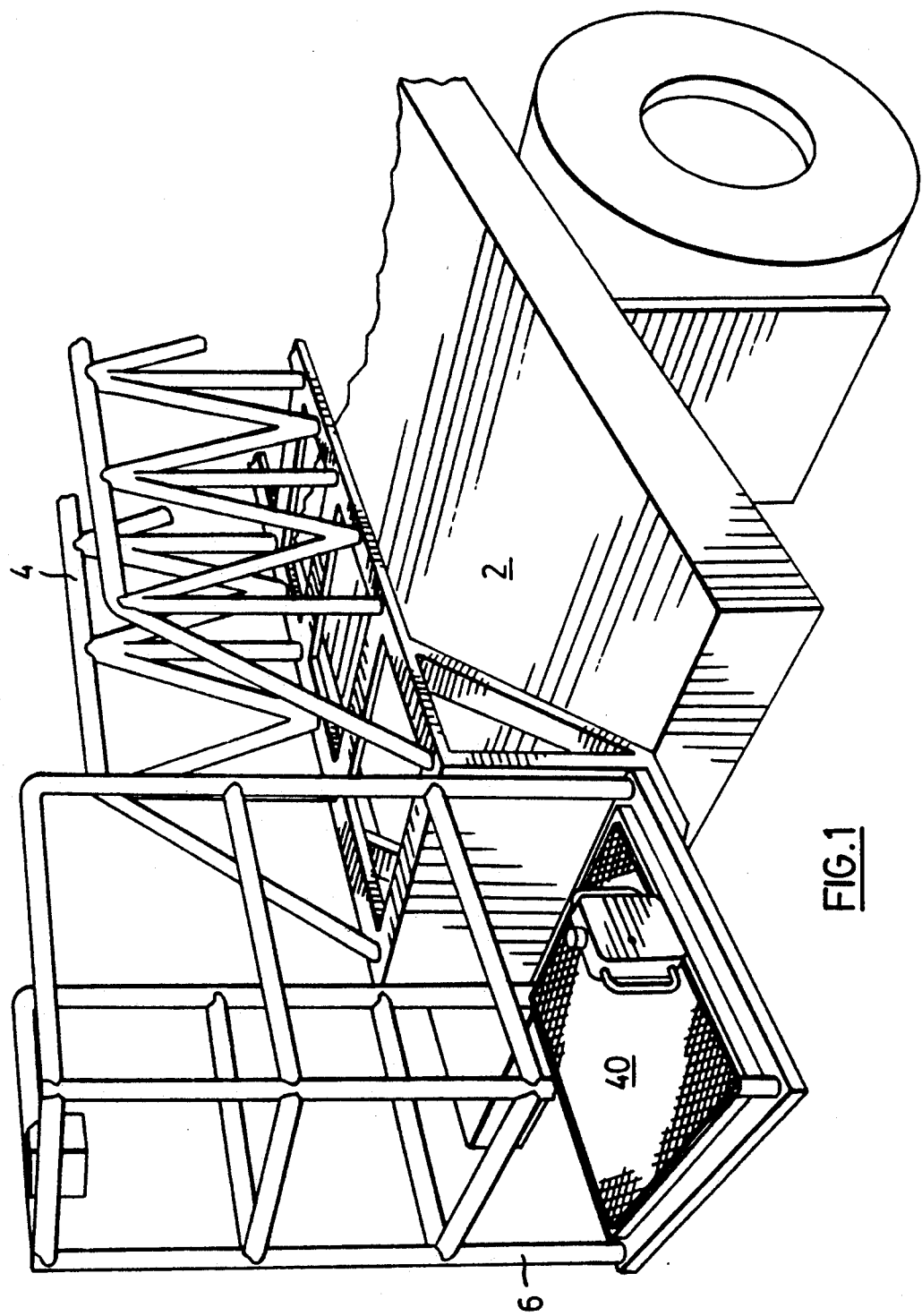
FIG. 1 is a perspective view of a basket for a powered aerial access device containing a platform embodying the subject invention.

Referring to FIG. 1, a basket or bucket 6 for aerial work is suspended from a ladder or boom 4 actuated by conventional means in a ladder truck 2 or another powered aerial access device. The basket 6 may be composed of a conductive material, such as metal. In the case where the basket is grounded, the ladder or boom 4 may similarly be composed of metal. Where the lineman is to be "bonded" to a high voltage conductor, the basket 6 and boom 4 from which it is suspended must be composed of fibreglass or another non-conductive material; the basket 6 must be fitted with an inner conductive cage (not shown) of conventional design, and the cage is bonded to the high voltage conductor.

Figure 2:
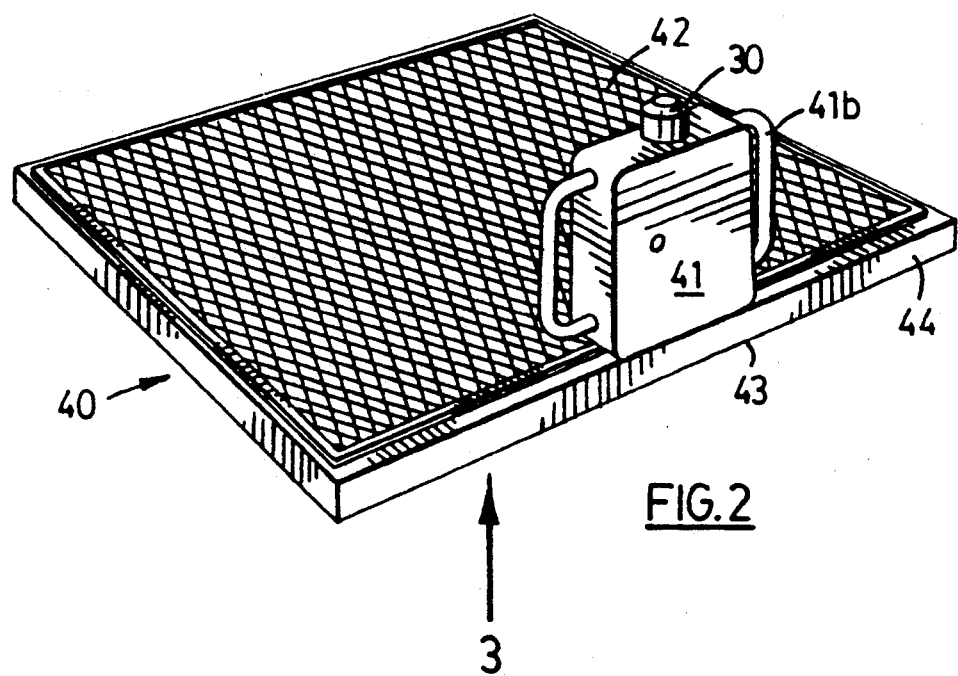
FIG. 2 is a perspective view of the platform embodying the subject invention.

A platform 40, illustrated in FIG. 2, comprises a conductive top plate or grate 42 raised from the floor of the basket 6 and separated from a conductive bottom plate 43 by an insulating layer 44. The top plate 42 acts as the inductor plate and the bottom plate 43 acts as a reference plate. The bottom plate 43 may be referenced to ground, to a floating potential, or to the potential of a high voltage conductor to which the basket 6 is bonded, as described below.

Figure 3:
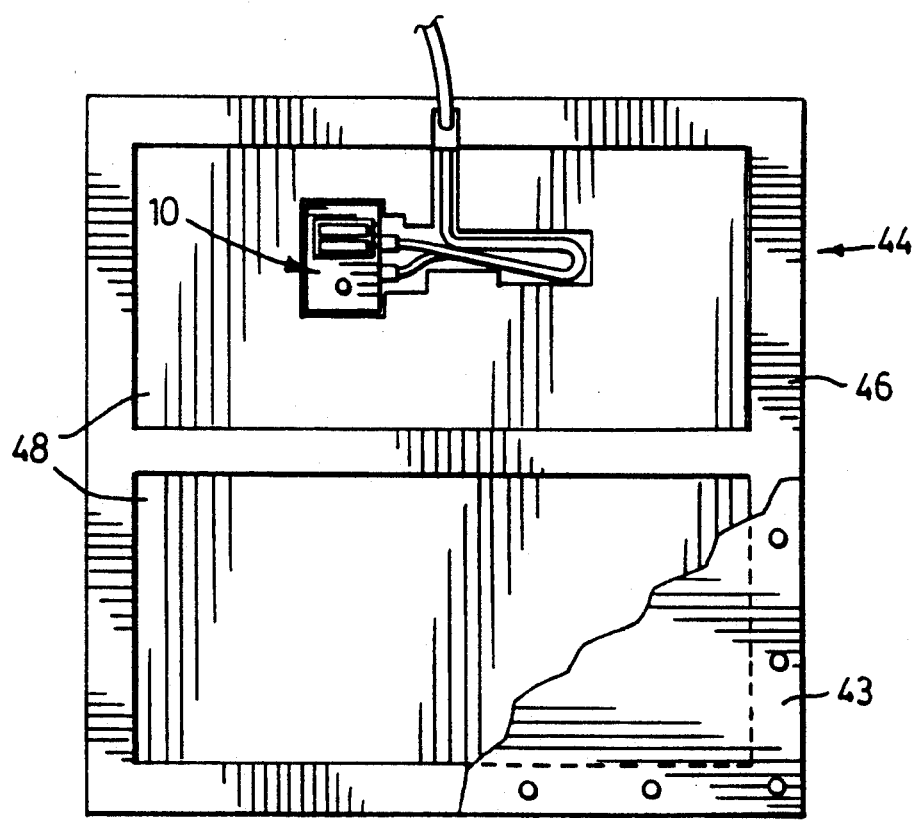
FIG. 3 is a bottom elevation of the platform of FIG. 2 with the bottom plate partially cut away.

As shown in FIG. 3, the insulating layer preferably comprises a frame 46 of high density polyethylene surrounding panels 48 of insulating foam, overall approximately one inch thick, and preferably having dimensions corresponding closely to the floor of the basket 6 to avoid slippage when the powered aerial access device is in motion. Affixed to a convenient location of the platform 40 is a housing 41 containing an audible alarm and a reset button 30 for resetting the monitoring circuitry. The housing 41 may also contain batteries for powering the circuitry 10 and the alarm. Preferably the platform 40 is self-contained and portable, and a pair of handles 41b is provided for carrying the platform 40.

The circuitry 10 may be located within the insulating foam 48, as shown in FIG. 3, or within the housing 41 if desired for easier access in servicing and maintenance. The housing 41 may be affixed to the platform 40 or may be connected by a wire and clipped to a convenient portion of the basket 6.

Figure 4:
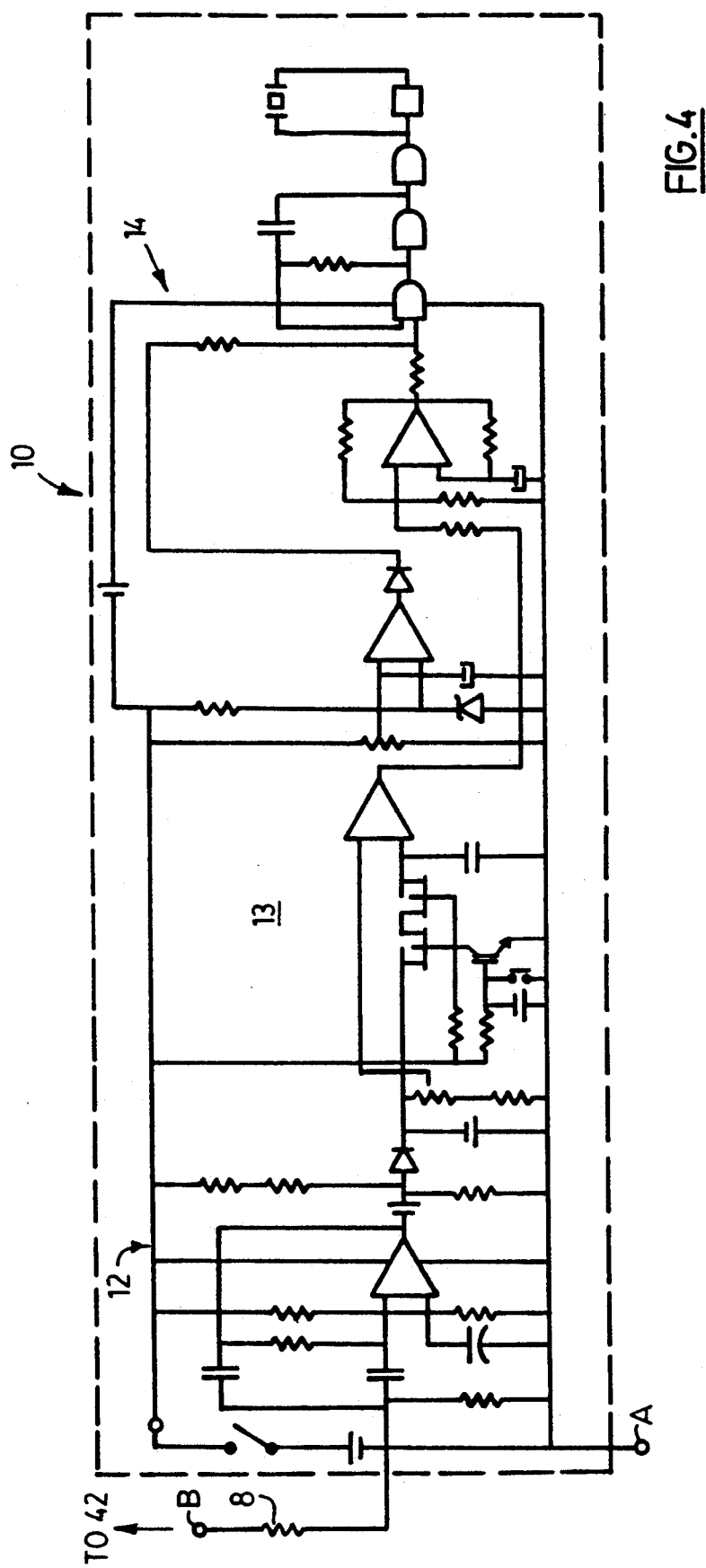
FIG. 4 is a schematic diagram illustrating the monitoring circuitry of the present invention.

The monitoring circuitry 10 is of the type comprising conventional detector circuit means 12, to the input of which the top plate 42 is connected through resistor 8, for deriving a DC signal corresponding to the potential induced in the user's body by the electrostatic field; conventional comparator means 13 comparing the DC signal with a selected reference level produced in the bottom plate 43, for producing an output signal when the derived DC signal exceeds the reference level; and conventional audible alarm means 14 activated by the comparator output signal comprising an oscillator circuit which drives a transducer. The circuitry is essentially as described in U.S. Pat. No. 4,714,915, except as described below and modified such that input B is coupled to the top plate 42 and reference terminal A is coupled to the bottom plate 43. Microprocessor equivalents may be preferred to the analogue circuitry illustrated in FIG. 4.

The range of operation is determined by the value of resistor 8, interposed between the top plate 42 and the detector circuit 12. The appropriate resistance of resistor 8 is selected to detect a range of voltages induced by an electrostatic field corresponding to the voltage most likely to constitute a hazard to the user.

For example, the following table provides preferred values for resistor 8 corresponding to the listed voltage difference between the user and ground potential (induced voltage in user's body):

| Voltage Difference | Value of Resistor 8 |
| --- | --- |
| 1 to 10V | 10MΩ |
| 10 to 100V | 1MΩ |
| 100 to 1000V | 100KΩ |

The reset circuitry described in U.S. Pat. No. 4,714,915 includes a delay device whereby, following actuation of the manual reset button 30, the circuit delays for two or three seconds before resetting. This is to avoid the "hand proximity effect" whereby merely pressing the reset button 30 would activate the alarm. In the present invention, making the user himself the antenna for the device eliminates the hand proximity effect which has previously posed a problem with monitoring devices of this type, and thus eliminates the need for reset delay circuitry.

In operation, the platform 40 is placed on or secured to the bottom of the basket 6 for an aerial device. The lineman may be wearing either conductive-soled or non-conductive-soled footwear; in the former case when standing on the top plate 42 he is directly coupled to it, and in the latter case when standing on the top plate 42 he is capacitively coupled to it. In either case when standing on the top plate 42 the user's body forms an extension thereof.

If the lineman will be working near, but not on, high voltage conductors, which he intends to avoid, the basket may be grounded (at A in FIG. 4) through the boom 4 and truck 2. Alternatively the bottom plate 43 may be permitted to act as a floating reference, i.e. if not grounded it will assume a potential induced by the electrostatic field, which potential differs from the induced potential of the top plate 42 because its distance from the field source differs from that of the top plate 42.

The lineman approaches his safe work location or distance from the high voltage conductor, and at this position pushes the reset button 30 to set the alarm point. This sets the reference signal at the potential difference between the top plate 42 and the bottom plate 43 at the moment that the reset button 30 is depressed. The monitoring circuitry 10 essentially acts as an alarming AC voltmeter with a variable set point set by depressing the reset button 30. The circuitry 10 monitors the potential difference between the top plate 42 and bottom plate 43, and sounds an alarm when this voltage exceeds the set point. The alarm will thus sound whenever any portion of the lineman's body strays closer than this minimum selected distance from the high voltage conductor. Audible alarm means is preferred, but conventional visual or even tactile alarm means may also be used.

In the case where the lineman will be working on a high voltage conductor, and thus will be "bonded" or coupled to it, the basket 6 must be insulated from ground. In this situation the basket 6 is suspended from a boom 4 made of fibreglass or other non-conductive material. Upon contacting the energized conductor the lineman's body is energized to the same voltage and phase, and a lineman may thus perform barehand live line work safely and without any discomfort, but must avoid contact with any grounded object or conductor of a different voltage or phase. The conductive cage within the basket 6 itself is thus coupled to the conductor through a bonding clamp (not shown), and it too becomes energized. Because the bottom plate 43 contacts the floor of the inner conductive cage, the circuitry 10 is referenced to the conductive cage potential (at A in FIG. 4), in which case the conductive cage itself will act as a reference plate, coupled to A through the bottom plate 43 or coupled directly to A if desired. The lineman resets the monitoring circuitry at his safe work location and may then work comfortably on the high voltage conductor. If the lineman strays closer than the minimum selected distance from a grounded or differentially energized conductor, the alarm will sound.

It can thus be seen that significant advantages obtain by coupling the lineman to the inductor plate 42 to act as an extension thereof. Since the induced voltage present on the worker's body determines the strength of the derived DC signal fed to the comparator 13, which increases with the intensity of the electrostatic field, the monitoring circuitry effectively monitors the strength of the electrostatic field at exactly the desired location: the user himself.

A preferred embodiment of the invention has been described above by way of example. However, it will be apparent to those skilled in the art that various modifications and adaptations may be made to the invention without departing from the scope of the invention. The invention is intended to include all such adaptations and modifications as fall within the scope of the claims appended hereto.

We claim:

1. A portable monitoring system for detecting a voltage induced in a user's body by a radiated electrostatic field, and producing a warning when the detected voltage exceeds a selected value, comprising
   a platform suitable for the user to stand on, having an inductor plate separated from a reference plate by an electrically insulating frame whereby the inductor plate is electrically coupled to the user, and
   a monitoring circuit having detector circuit means for deriving a DC signal corresponding to the detected voltage, comparator means for comparing the DC signal with a selected reference signal representing the potential difference between the inductor plate and the reference plate, and alarm means responsive to an output signal from the comparator.

2. The monitoring system defined in claim 1 wherein the alarm means comprises audible alarm means.

3. The monitoring system defined in claim 1 wherein the detector circuit is housed within the insulating frame.

4. The monitoring system defined in claim 2 wherein the alarm is housed within a housing affixed to the top of the platform.

5. The monitoring system defined in claim 4 wherein the housing contains a power supply.

6. The monitoring system defined in claim 5 wherein the housing includes a switch for resetting the detector circuit.

7. The monitoring system defined in claim 3 wherein the insulating frame comprises high density polyethylene.

8. A powered aerial access device for elevating a person comprising a vehicle having actuating means for raising and lowering a basket, the basket including a conductive floor,
   a plate form having an inductor plate overlaying and insulated from the conductive floor, and
   monitoring circuitry comprising a detector circuit for deriving a DC signal corresponding to a detected potential on a person's body, comparator means for comparing the DC signal with a selected reference signal for producing an output signal when the DC signal level exceeds the reference signal level, and alarm means responsive to the output signal whereby the reference signal represents a potential difference between the inductor plate and a reference plate insulated from the inductor plate.

9. A powered aerial access device as defined in claim 8 wherein the alarm means comprises audible alarm means.

10. A powered aerial access device as defined in claim 8 whereby the reference plate comprises a portion of the conductive floor.

11. A powered aerial access device as defined in claim 10 wherein the conductive floor is grounded.

12. A powered aerial access device as defined in claim 10 wherein the conductive floor is coupled to a high voltage conductor.

* * * * *